(12) United States Patent
Davidson et al.

(10) Patent No.: US 6,307,666 B1
(45) Date of Patent: Oct. 23, 2001

(54) VOLTAGE SENSING SYSTEMS AND METHODS FOR PASSIVE COMPENSATION OF TEMPERATURE RELATED INTRINSIC PHASE SHIFT

(75) Inventors: James R. Davidson; Gordon D. Lassahn, both of Idaho Falls, ID (US)

(73) Assignee: Bechtel BWXT Idaho, LLC, Idaho Falls, ID (US)

(*) Notice: Subject to any disclaimer, the term of this patent is extended or adjusted under 35 U.S.C. 154(b) by 0 days.

(21) Appl. No.: 09/483,716

(22) Filed: Jan. 13, 2000

(51) Int. Cl.[7] .................................................. G02F 1/00
(52) U.S. Cl. ...................... 359/322; 359/251; 359/257; 324/96; 324/105; 250/227.17; 250/227.21; 385/12
(58) Field of Search ............................... 359/322, 245, 359/246, 251, 257, 249; 324/96, 750, 753, 105; 250/227.17, 227.21; 356/365; 382/12

(56) References Cited

U.S. PATENT DOCUMENTS

| | | | |
|---|---|---|---|
| 4,904,931 | * 2/1990 | Miller | 324/96 |
| 4,971,413 | * 11/1990 | Inoue | 359/245 |
| 5,109,189 | * 4/1992 | Smith | 359/251 |
| 5,157,324 | * 10/1992 | Chollet | 324/96 |
| 5,157,539 | * 10/1992 | Beasley | 359/251 |
| 5,247,244 | * 9/1993 | Miller et al. | 359/249 |
| 5,635,829 | * 6/1997 | Hamada | 324/96 |
| 5,731,579 | * 3/1998 | Woods | 250/227.17 |
| 5,892,357 | * 4/1999 | Woods et al. | 324/96 |
| 5,939,711 | * 8/1999 | Crawford et al. | 250/227.17 |
| 6,124,706 | * 9/2000 | Woods et al. | 324/96 |

* cited by examiner

Primary Examiner—Loha Ben
(74) Attorney, Agent, or Firm—Workman Nydegger & Seeley (57) ABSTRACT

A small sized electro-optic voltage sensor capable of accurate measurement of high levels of voltages without contact with a conductor or voltage source is provided. When placed in the presence of an electric field, the sensor receives an input beam of electromagnetic radiation into the sensor. A polarization beam displacer serves as a filter to separate the input beam into two beams with orthogonal linear polarizations. The beam displacer is oriented in such a way as to rotate the linearly polarized beams such that they enter a Pockels crystal at a preferred angle of 45 degrees. The beam displacer is therefore capable of causing a linearly polarized beam to impinge a crystal at a desired angle independent of temperature. The Pockels electro-optic effect induces a differential phase shift on the major and minor axes of the input beam as it travels through the Pockels crystal, which causes the input beam to be elliptically polarized. A reflecting prism redirects the beam back through the crystal and the beam displacer. On the return path, the polarization beam displacer separates the elliptically polarized beam into two output beams of orthogonal linear polarization representing the major and minor axes. In crystals that introduce a phase differential attributable to temperature, a compensating crystal is provided to cancel the effect of temperature on the phase differential of the input beam. The system may include a detector for converting the output beams into electrical signals, and a signal processor for determining the voltage based on an analysis of the output beams. The output beams are amplitude modulated by the frequency of the electric field and the amplitude of the output beams is proportional to the magnitude of the electric field, which is related to the voltage being measured.

35 Claims, 8 Drawing Sheets

VOLTAGE SENSING SYSTEMS AND METHODS FOR PASSIVE COMPENSATION OF TEMPERATURE RELATED INTRINSIC PHASE SHIFT

CONTRACTUAL ORIGIN OF THE INVENTION

The United States Government has rights in this invention pursuant to Contract No. DE-AC07-94ID13223 between the United States Department of Energy and Lockheed Martin Idaho Technologies Company, now Contract No. DE-AC07-99ID13727 with Bechtel BWXT Idaho, LLC.

BACKGROUND OF THE INVENTION

1. Field of the Invention

The present invention relates generally to systems and devices for electrooptically measuring and sensing voltages. More particularly, the present invention relates to systems and devices for sensing and measuring high voltages associated with electric fields produced by energized conductors.

2. Relevant Technology

The ability to accurately sense and measure power is an important aspect of power systems and the power industry. Currently, however, power measurement and metering is typically performed only when necessary, which frequently occurs on the high voltage or power source side before the voltage is stepped down for distribution. As the power industry deregulates, it is becoming more important to accurately track and measure power, which indicates that additional measuring and metering is needed in the power infrastructure. Power measurements are made by determining the values of both the current and the voltage. While current measurements are easily performed and are readily available as many current measurement devices are currently in place, voltage measurements are not readily available and can be rather difficult to accurately obtain.

High voltage measurement is traditionally accomplished using iron core ferromagnetic potential transformers. Potential transformers, however, are problematic for a variety of reasons. They exhibit a limited dynamic range, have limited bandwidth, and introduce a substantial degree of non-linearity. Also, potential transformers have been observed to unintentionally conduct dangerous levels of energy downstream towards equipment or personnel thereby creating a serious safety hazard.

Many conventional methods for sensing and measuring high voltages, including potential transformers, require direct electrical contact with the energized conductor, which has the major disadvantage of causing interruptions or interference with the power transmission of a system due to the presence of an additional load. Prior voltage sensing and measuring systems also tend to be relatively bulky due to the requirement for a large voltage divider which is necessary to connect the sensing element with the energized conductor. Large voltage dividers are not only space consuming, but are also expensive and difficult to implement in many situations. For example, the installation of a substation in a large city is quite difficult because the available real estate in which to install the substation is very limited. In other words, the ability to effectively measure high voltages as well as power can be difficult and expensive.

Another favored method for measuring a voltage or a potential is related to the electric field associated with the potential. Open air electric field sensors have been designed and built but are extremely susceptible to factors such as changes in ambient dielectric constant, adjacent conductor voltages, and conducting objects such as traveling motor vehicles, which induce signals and noise which can interfere with or override the reading of the voltage to be measured.

Relatively recently, optical sensors have been designed for voltage sensing applications, such as those which utilize interferometric modulation. Although relatively compact, such systems suffer from extreme temperature sensitivity, which makes these types of systems impractical for many situations. Optical sensors which are mechanically modulated have also been attempted, but suffer from unreliability due to failure of the moving parts in these systems.

Optical voltage sensors which operate by taking advantage of the Pockels effect have also been developed. The Pockels effect is an electro-optic effect which is manifested in certain crystalline materials which have the property of advancing or retarding the phase of polarized light waves when a voltage or an electric field is applied to the crystalline material. The effect on the phase of the light wave is linearly proportional to the first power of the applied voltage, which makes it ideal for accurate voltage sensing and measuring applications.

Thus, the electromagnetic beam or light wave passing through the Pockels crystal or cell undergoes an electro-optic effect when the crystal is subjected to an electric field. The electro-optic effect is observed as a differential phase shift, or a differential phase modulation, of the electromagnetic beam components in orthogonal planes of the electromagnetic radiation. The degree to which the electromagnetic beam is altered is indicative of the strength of the electric field. By determining the amount of the alteration, or the amount of the differential phase, the voltage being measured can be determined.

In order to effectively measure a high voltage, a typical Pockels cell voltage sensor requires a half-wave plate and a beam splitter. The beam splitter is used to separate the orthogonal components of the elliptically polarized beam such that the differential phase can be determined. The half-wave plate is necessary to properly orient the electromagnetic beam as it enters and leaves the Pockels crystal. If the half-wave plate is not positioned correctly, the voltage will not be measured accurately.

The half-wave plate is a both a critical part of current electro-optic voltage sensors and a source of inaccurate voltage measurements. The problem with half-wave plates stems from their extreme sensitivity to temperature. For example, the half-wave plate is responsible for rotating the electromagnetic beam by before it enters the Pockels cell. The wavelength of the light wave passing through the half-wave plate is very small, and the effect of temperature on the half-wave plate, which alters the dimensions of the half-wave plate, can ultimately have a significant effect on the accuracy of voltage measurements because the light wave is not properly rotated to the desired degree.

Another problem associated with many electro-optic voltage sensors is that they are inherently sensitive to temperature variations which introduce an intrinsic phase shift to the electromagnetic beam which is passing through the crystal. The reason for the intrinsic phase shift is related to the bi-refringent properties of the Pockels crystals. Many applications utilize a crystal in which the indices of refraction are not equal. As temperature changes, the indices of refraction also change. Unfortunately, the change in the indices of refraction is linear in each direction and the difference between the indices of refraction is thereby changing as the temperature changes. This change is both difficult to measure and ultimately remove from voltage calculations. As a result, an accurate measurement may require that the temperature of the Pockels crystal be constantly monitored. Otherwise, it is very difficult to account for the inherent differential phase shift which is thereby introduced. Additionally, monitoring the temperature introduces unwanted cost.

It would therefore be a significant advantage in the art to provide a compact voltage sensing or measuring apparatus which: does not require direct electrical contact with the energized conductor; is capable of accurate operation under a wide range of variable temperatures and environmental conditions; is reliable; is cost effective; and is substantially unaffected by temperature.

SUMMARY AND OBJECTS OF THE INVENTION

It is therefore an object of one embodiment of the present invention to provide a device for the measurement of a voltage which does not require direct electrical contact with a conductor.

It is a further object of one embodiment of the present invention to provide a voltage sensor device which is relatively insensitive to temperature and is capable of use in a wide variety of environmental conditions.

It is yet another object of one embodiment of the present invention to provide a voltage sensor apparatus which can accurately measure high levels of voltage without a voltage divider.

It is a further object of one embodiment of the present invention to provide a voltage sensor apparatus which is of relatively small size.

It is yet another object of one embodiment of the present invention to provide a voltage sensor which is capable of being integrated with existing power transmission and distribution equipment.

It is still a further object of one embodiment of the present invention to provide a voltage sensor which uses the electro-optic Pockels effect without requiring a wave plate or an external beam splitter.

It is yet another object of one embodiment of the present invention to compensate for a temperature induced phase differential in a Pockels crystal.

It is a further object of one embodiment of the present invention use multiple crystals in order to compensate for temperature induced variations in the indices of refraction and their effect on an input beam propagating through the crystals While the present invention is described in the context of a high voltage sensor, it is to be understood that the present apparatus may be used in any type of electrical or optical application. The above objects are realized in a specific illustrative embodiment of an electro-optic voltage sensor device whereby the voltage difference (electrical potential difference) between objects and positions may be measured. Voltage is a function of the electric field and the geometries, compositions, and distances of the conductive or insulating matter and when the effects of an electric field can be observed, a voltage can be calculated.

The sensor device can be utilized to sense and measure an electric field using a beam of electromagnetic radiation which passes through the sensor. In order the effectively measure an electric field using an electro-optic device, it is necessary to linearly polarize an electromagnetic radiation or input beam. This is accomplished using a material such as calcite that exhibits bi-refringent properties. Thus, an input beam is physically split into two separate and orthogonal linearly polarized beams whose polarizations are parallel to, for example, the x and y axes of the calcite.

The calcite is connected to a crystal which exhibits the Pockels effect in the presence of an electric field. The calcite is oriented such that one of the linearly polarized beams is effectively rotated by approximately 45 degrees as it impinges the Pockels cell. In other words, the x axis of the calcite is offset 45 degrees from the x axis of the Pockels cell. As the beam travels through the Pockels crystal, the electric field causes the beam to become elliptically polarized. The beam is reflected back through the Pockels crystal towards the calcite using a prism or other reflecting device. Reflecting the beam through the Pockels cell a second time has the advantages of adding to the Pockels effect and increasing the sensitivity of the sensor.

As the beam exits the Pockels crystal and enters the calcite, it is physically separated into two output beams which correspond to the major and minor axes of the elliptically polarized beam. As stated, the calcite separates these components because of the bi-refringent property of the calcite. The output beams are collected and analyzed to determine the peak-to-peak value of the voltage as well as the root-mean-square (RMS) value of the voltage. The output beams are 180 degrees out of phase, but have equal magnitudes and are amplitude modulated by the frequency of the electric field.

The input and output beams are collimated using, for example, a graded index lens attached either to the sensor or to the fiber optic cables which carry the input and output beams to and from a detector. The detector both supplies the input beam and receives the output beams.

An important aspect of the orientation of the calcite portion of the sensor is that it eliminates the need for both a waveplate and a beam splitter. The orientation of the calcite block with respect to the Pockels crystal effectively provides the rotation of the linearly polarized input beam which was previously provided by the waveplate. However, the effective rotation provided by the calcite is not temperature dependent. Thus, a beam rotation, which was previously attributable to the variations of the wave plate caused by temperature, is avoided. Further, the Pockels cell is preferably a z-cut crystal having indices of refraction in the x and y directions that are equal when the crystal is static. This eliminates the phase differential introduced by crystals having nonequal indices of refraction which change with respect to temperature. Alternatively, if the Pockels cell is an intrinsically bi-refringent material, a compensating crystal may be added to cancel any induced phase differential that is attributable to temperature variations.

The output beams are received by photo detectors which convert the optical signals into electrical signals. The two or more amplitude modulated signals can be processed in an analog or digital circuit, or both. The amplitude modulated signals may be, for example, converted to digital signals, fed into a digital signal processor (DSP), and processed into a signal proportional to the voltage which produced the electric field. The amplitude modulated signals could also be optically processed. Alternatively, the output of the analog circuit, which may be in the form of a sinusoidal signal, may be used to calculate the peak-to-peak voltage and an RMS voltage values of the voltage being measured.

Advantages of the present invention will become apparent from the following description, taken in connection with the accompanying drawings, wherein, by way of illustration and example, embodiments of the present invention are disclosed.

The drawings constitute a part of this specification and include exemplary embodiments to the invention, which may be embodied in various forms. It is to be understood that in some instances various aspects of the invention may be shown exaggerated or enlarged to facilitate an understanding of the invention.

DETAILED DESCRIPTION OF THE PREFERRED EMBODIMENTS

Voltages, potentials and electric fields are present in a variety of different systems. They can be found in airplanes, locomotives, radar mapping applications, electric field mapping applications, lightning detection applications, and in applications for sensing high frequencies. In particular, voltages and electric fields are present in power systems and are a major concern of the power industry. Because voltages, electric fields and the associated power are an integral part of many applications, it is vital that they be accurately measured or sensed.

As described previously, sensing and measuring voltages or electric fields has proven problematic for a variety of reasons. For example, as the power needs of large cities grows, it is necessary to either expand or create new substations such that the power may be safely distributed. Part of the expansion or creation of a substation involves the installation of both power and potential transformers. The potential transformers are used to measure the voltage of the power transformers. A safe installation is subject to a myriad of requirements including sufficient real estate to accommodate the bulky transformers. Sufficient real estate is a scarce commodity in large cities, which makes it both difficult and expensive to expand or install power substations. Another problem is that many existing devices utilized to sense and measure voltages require a direct electrical connection to the conductor having the voltage or potential.

The present invention is directed to systems and apparatus for sensing and measuring high voltages without requiring direct electrical contact with a conductor. In particular, the present invention utilizes the Pockels effect to sense and measure an electric field, from which a corresponding voltage can be calculated. The present invention does not require a direct electrical connection and provides a safe and compact measuring system for high levels of voltage. The electro-optic voltage sensor of the present invention is capable of providing accurate measurements under a wide variety of environmental conditions, and is particularly suitable for environments generating high voltages, such as those present in power substations.

As used herein "input beam" is intended to refer to electromagnetic radiation, including electromagnetic radiation having wavelengths within the visible spectrum or beyond the visible spectrum. Input beam further refers to monochromatic light and is intended to encompass all beams and signals that have electromagnetic properties. As used herein "output beam" is intended to refer to an input beam that has been subjected to an electric field. The effect of the electric field on an input beam is evident in the output beam, which enables the magnitude of the electric field and associated voltage to be accurately measured.

Figure 1:
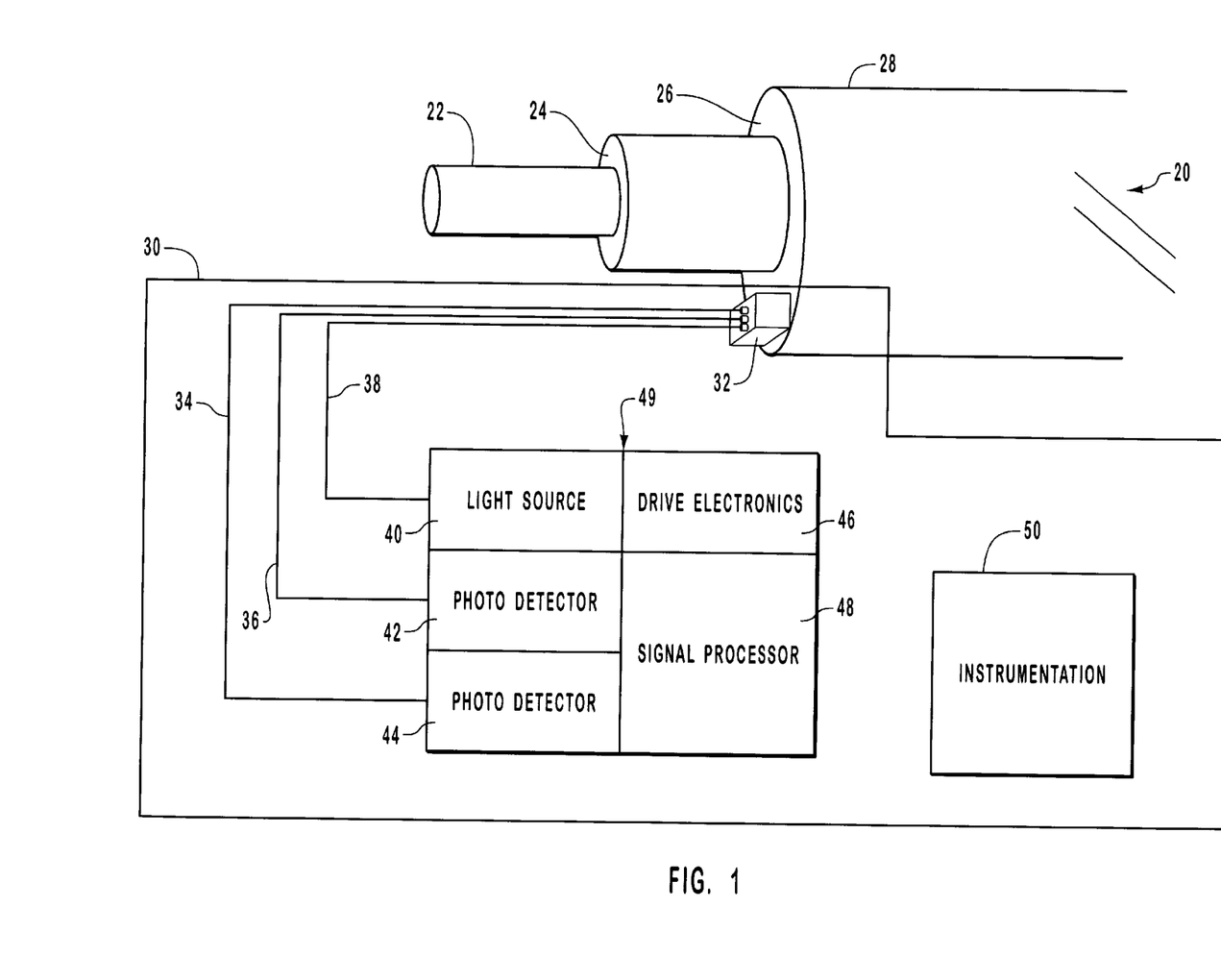
FIG. 1 is a block diagram of an environment in which a preferred embodiment of an electro-optic voltage sensor system may be implemented.

FIG. 1 illustrates an environment in which an apparatus or system for sensing and measuring a voltage may be implemented. Electro-optic voltage sensor system 30 is illustrated as being capable of sensing the potential or voltage present on voltage source 20. Voltage source 20 has an energized conductor 22 and a grounded conductor 26, which is frequently covered with sheath 28. In addition, voltage source 20 may have an insulator 24, which may have dielectric properties. Voltage source 20 is illustrated as a high voltage cable and is intended to be an example of a device which has a high voltage present and is a source of an electric field. Other potential devices include a shielded cable joint, a through-hole insulator, a shielded bus, an insulated switchgear, a duct enclosed bus, or any other device or apparatus which generates an electric field. Voltage source 20 includes apparatus present at power substations from which a high voltage measurement may be taken.

Conductor 22 typically has a higher potential than conductor 26 and as a result, a measurable potential or voltage is present between conductor 22 and conductor 26. Accordingly an electric field exists between conductor 22 and conductor 26 that is dependent on the geometries, compositions, and distances of the conducting and insulating materials. As illustrated, the electric field begins on conductor 22 and extends radially to conductor 26, where the electric field is terminated.

The ability of system 30 to sense and measure a voltage and an electric field begins with sensor 32. Sensor 32 receives, via fiber optic cable 38, an input beam, such as laser light, monochromatic light or other beam, which is generated by light source 40. The input beam is transmitted from light source 40 into sensor 32, which is positioned in the electric field generated by voltage source 20. As the input beam travels through sensor 32, it is acted upon by the electric field, which creates an output beam having a differential phase between the components of the beam propagating along orthogonal axes. The electric field is capable of modulating the output beam. The output beam then exits sensor 32 via fiber optic cables 34 and 36 and is collected by photo detectors 42 and 44. Fiber optic cables 38, 34, and 36 are capable of optically communicating an input or output beam to and from sensor 32. Fiber optic cable 38 is preferably a single mode optical fiber and fiber optic cables 34 and 36 are preferably multi-mode optical fibers.

After the output beams are transmitted to photo detectors 42 and 44, they are processed by signal processor 48. Signal processor 48 may comprise a computer or other device capable of processing the electrical signals provided by photo detectors 42 and 44. The information from signal processor 48 may be illustrated on instrumentation 50. Signal processor 48 is able to compute the voltage present across conductor 22 and conductor 26 based on the information provided by the output beams. Signal processor 48 is also capable of controlling detector 49, which comprises signal processor 48, drive electronics 36, light source 40 and photo detectors 42 and 44.

As further illustrated in FIG. 1, sensor 32 is preferably placed between conductor 22 and conductor 26 and sensor 32 is further illustrated as being placed near ground conductor 26. Placing sensor 32 in this manner eliminates the effect of external electric fields on sensor 32 because they are shielded from sensor 32 by conductor 26. Further, sensor 32 may be placed in physical contact with conductor 26 or 22, but it is not in direct electrical contact with either conductor 22 or conductor 26. Alternatively, sensor 32 need not be in physical contact with either conductor 22 or conductor 26. In other words, sensor 32 is isolated from the conductors and does not present a load to voltage source 20.

Sensor 32 is optically isolated from conductor 22 and will not conduct power away from voltage source 20. The effect of the electric field on an input beam passing through sensor 32 is evident in the differential phase of the input beam. Because the input beam has a differential shift, it is amplitude modulated by the frequency of the electric field. The amplitude of the resultant output beam is proportional to the magnitude of the electric field, which in turn is proportional to the magnitude of the voltage being measured. As a result, the peak-to-peak value and root-mean-square (RMS) values of the voltage are easily determined.

Figure 2A:
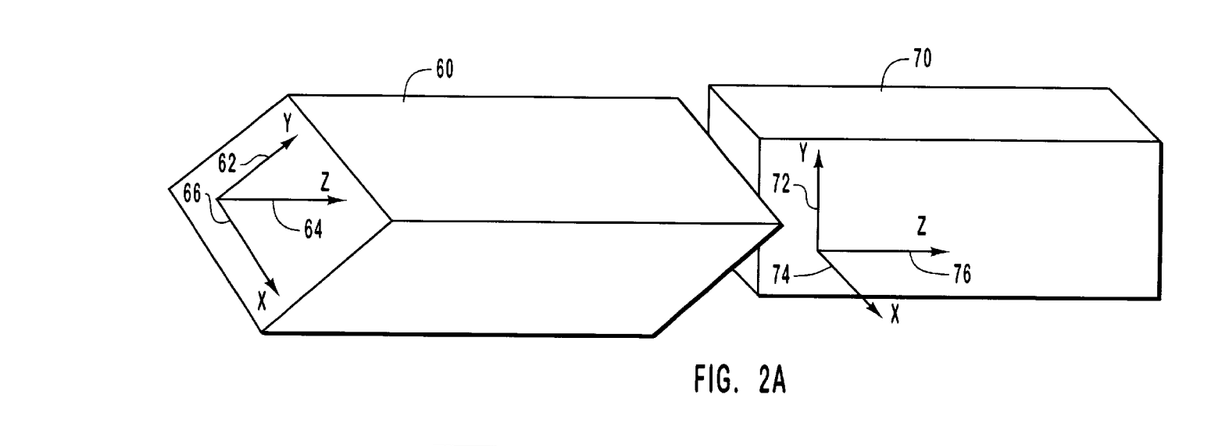
FIG. 2a is a block diagram illustrating both the orientation of a beam displacer with respect to a Pockels crystal and the respective axes of the beam displacer and the Pockels crystal.

FIG. 2a is a schematic diagram illustrating the orientation of beam displacer 60 with respect to crystal 70. The axes of beam displacer 60 are illustrated as x axis 66, y axis 62 and z axis 64. The z axis 66 is the direction of propagation for both input and output beams. Beam displacer 60, in a preferred embodiment, is calcite, which is a birefringent material. The bi-refringence of beam displacer 60 causes an input beam to be separated into orthogonal linearly polarized beams.

The axes of crystal 70 are illustrated as x axis 74, y axis 72 and z axis 76, where the z axis 76 is illustrated as the direction of propagation for both input and output beams. This orientation is referred to as a z-cut crystal, but other crystal cuts may be used such that the direction of propagation is any of the available axes. In other embodiments, the direction of propagation may not coincide exactly with an axis. Crystal 70, in a preferred embodiment, is a magnesium oxide (MgO) doped lithium niobate (LiNbO$_3$) crystal. In the absence of an electric field, the index of refraction for both x axis 74 and y axis 72 are equal. In the presence of an electric field, the index of refraction parallel to the electric field is changed such that velocity of a component of the input beam that is parallel to the electric field is retarded. As a result, a linearly polarized input beam which impinges crystal 70 at a 45 degree angle exhibits a phase differential that is related to the magnitude of the electric field. In other crystals, the relevant indices of refraction may not be equal, in which case a temperature induced differential phase shift is introduced into the beam that is related to the effect of temperature on the respective indices of refraction. The present invention substantially eliminates the phase differential present in a propagating beam which is related to the effect of temperature on the relevant indices of refraction.

Figure 2B:
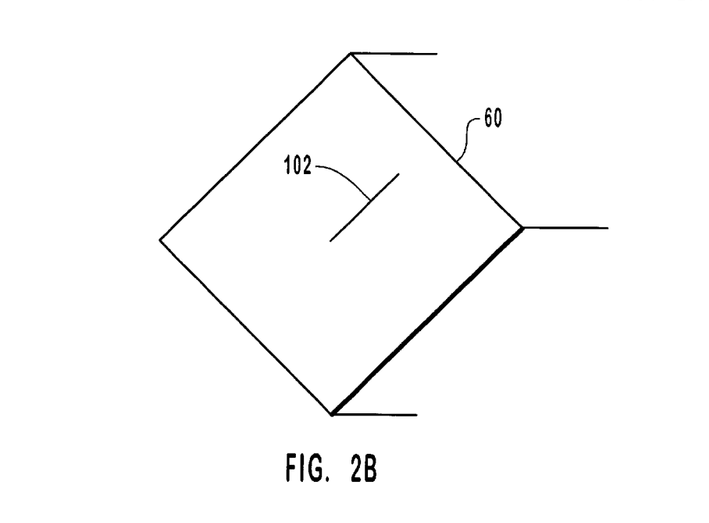
FIG. 2b is a block diagram illustrating a linearly polarized beam that is a planar wave propagating through the beam displacer.
Figure 2C:
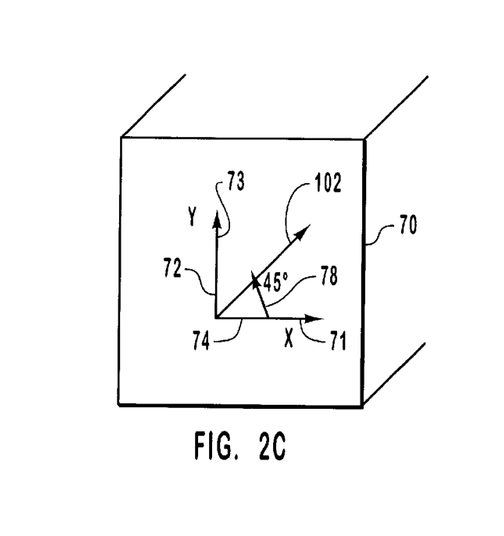
FIG. 2c illustrates how the linearly polarized beam impinges the Pockels crystal at a 45 degree angle.

FIG. 2b illustrates a portion of an input beam and is shown as component 102. Component 102 is linearly polarized and is parallel to an axis of beam displacer 60. The other component of an input beam which is also linearly polarized is illustrated in FIG. 3b. FIG. 2c illustrates component 102 as it exits beam displacer 60 and impinges crystal 70. The orientation of beam displacer 60 with respect to crystal 70, as illustrated in FIG. 2a, causes component 102 to impinge crystal 70 at angle 78, which is preferably 45 degrees from x axis 74.

Mathematically, component 102 can be represented as having major component 71 and minor component 73, which are parallel with x axis 74 and y axis 72 respectively. In the presence of an electric field, the propagation of either major component 71 or minor component 73 is delayed, which introduces a differential phase shift into component 102. Thus, the wavefront of component 102 may be viewed as elliptically polarized. The differential phase shift, in combination with the frequency of the electric field results in an amplitude modulated output beam, whose amplitude is proportional to the magnitude of the electric field. In this instance, the high frequency of component 102 is the carrier frequency whose amplitude varies according to the modulating frequency, which is the frequency of the electric field in this instance. In power applications, the modulating frequency is frequently 60 Hz.

Figure 3A:
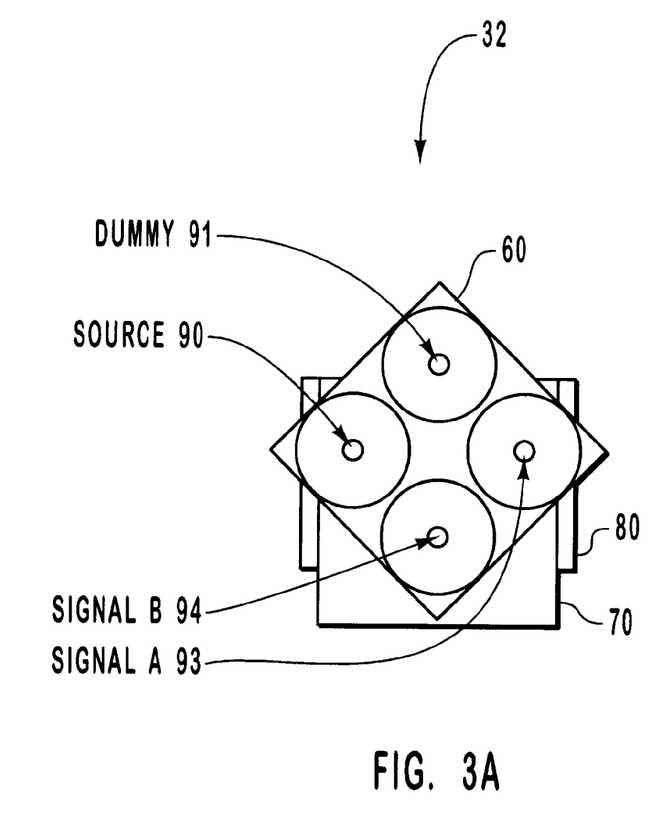
FIG. 3a is an end view of an electro-optic voltage sensor device and illustrates the orientation of the input and output structures as well as the orientation of a beam displacer with respect to a Pockels crystal and a prism.
Figure 3B:
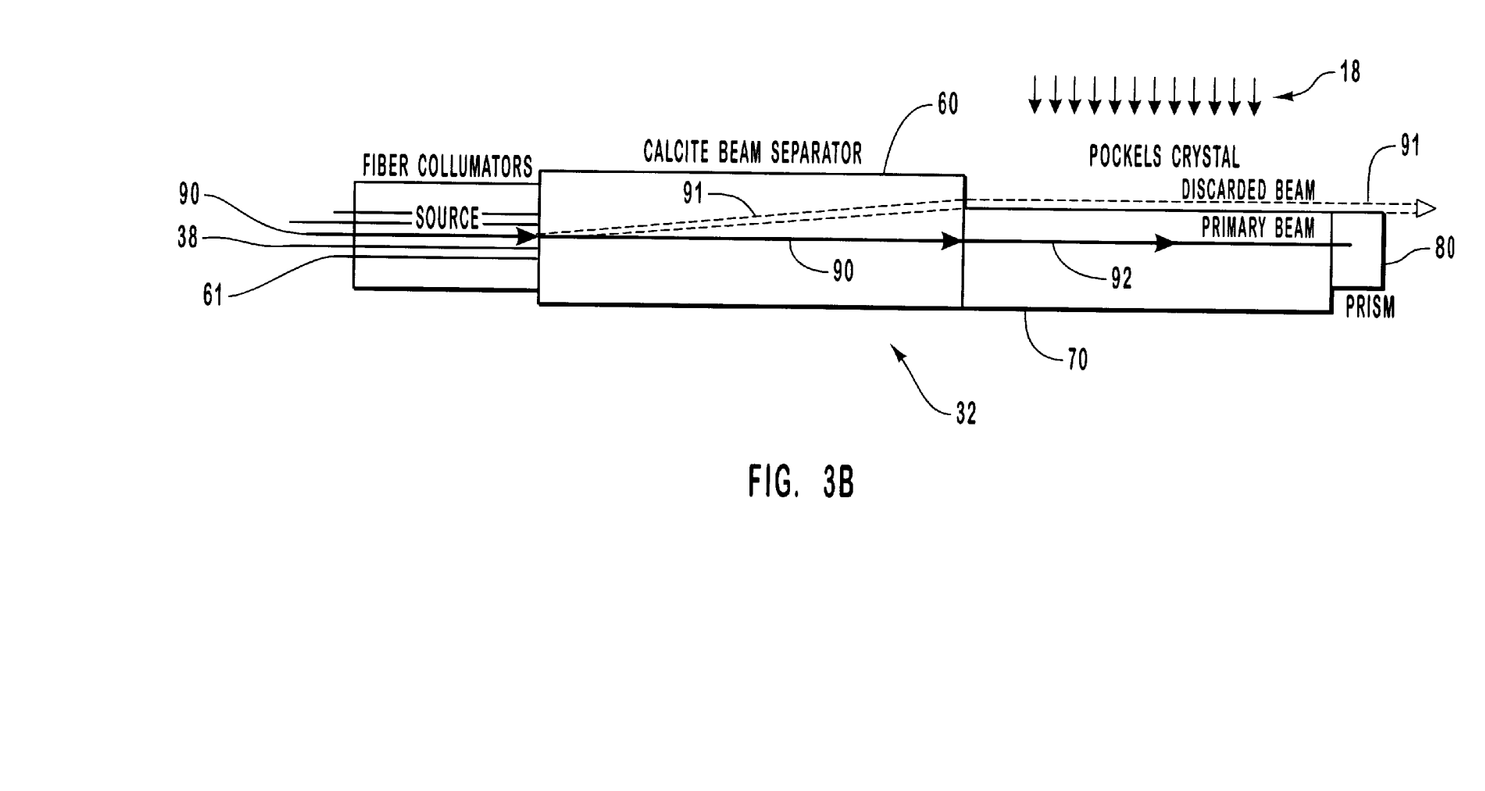
FIG. 3b is a source side view of a preferred embodiment of an electro-optic voltage sensor device and illustrates the path of an input beam and a displaced beam.

FIG. 3a is an end view of sensor 32 and illustrates the preferable configuration of the input and output beams. FIG. 3a also illustrates an end view of the beams as they are oriented in sensor 32. As shown, the end view illustrates beam displacer 60, crystal 70 and prism 80. The physical arrangement illustrated in FIG. 3a is important in order to effectively measure a voltage. As described previously, beam displacer 60 is oriented 45 degrees with respect to crystal 70. As an input beam enters beam displacer 60, it is split into two linearly polarized beams: input beam 90 and displaced beam 91. The physical orientation of the components of sensor 32 allow displaced beam 91 to be discarded without entering crystal 70 or prism 80. Displaced beam 91 propagates through beam displacer 60 and outside of crystal 70.

FIG. 3b is a source side view of sensor 32. The body of sensor 32 comprises a beam displacer 60, crystal 70 and prism 80. Beam displacer 60 has an input 61, which is connected to fiber optic cable 38. The operation of sensor 32 begins when input beam 90 is presented by fiber optic cable 38 to sensor 32 through input 61 Fiber optic cable 38 has a graded index (GRIN) lens attached to it which serves to collimate the input beam as the input beam enters beam displacer 60 and the GRIN lens is an example of collimating means for collimating electromagnetic radiation. As previously mentioned, a significant characteristic of beam displacer 60 is that it is bi-refringement. This characteristic indicates that beam displacer 60 has a different index of refraction along different axes. As a result, the input beam is divided into two separate linearly polarized beams indicated by beams 90 and 91.

The input beam generated by light source 40 in FIG. 1 and carried by fiber optic cable 38 to beam displacer 60 is preferably circularly polarized, but may have any polarization. Thus, the input beam is separated by beam displacer 60 to provide two physically separated planes of polarization. Beam 90 and beam 91 are both linearly polarized and are orthogonal with respect to each other. In this example, beam 91 is discarded and exits beam displacer 60 without entering crystal 70. Beam 91, which is a displaced beam, therefore does not enter crystal 70 or prism 80 and does not introduce any potential noise into the measurement of the voltage. Beam displacer 60 therefore serves as a filter which produces a linearly polarized input beam and is an example of filtering means for filtering a circularly polarized input beam to produce a linearly polarized input beam. Effectively, beam displacer 60, or the filtering means limits the input beam that enters crystal 70 to a single planar wave.

The orientation of beam displacer 60 with respect to crystal 70 is also significant as previously described. Beam displacer 60 eliminates the need of a half-wave waveplate because the linearly polarized input beam 90 enters or impinges crystal 70 at an angle substantially equal to 45 degrees because of the orientation of beam displacer 60 with respect to crystal 70. In other words, beam 90 is a linearly polarized input beam which is parallel to an axis of beam displacer 60, and as beam 90 exits beam displacer 60, it enters crystal 70 at an angle of approximately 45 degrees with respect to the x and y axes of crystal 70. Thus, the function of a waveplate, which is to rotate the input beam by an appropriate amount, is effectively performed by beam displacer 60. The waveplate is extremely temperature dependent, and the elimination of the waveplate from sensor 32 removes the effect of temperature on the beam rotation of beam 90 which was previously attributable to the half-wave waveplate. The overall effect is to improve the accuracy of the voltage measurement.

After beam 90 enters crystal 70, it is subject to the effects of electric field 18 and is denoted as beam 92. Beam 92, which can be represented as having a first component and a second component of equal magnitudes which are respectively parallel to the x and y axes of crystal 70. The electric field alters the index of refraction of one axis, which has the effect of slowing or retarding that component of beam 92. As a result, a phase differential is introduced into beam 92 and beam 92 becomes elliptically polarized.

The phase differential allows beam 92 to be amplitude modulated by electric field 18. The modulating frequency is the frequency of electric field 18 and the carrier frequency is equal to the frequency of beam 92. The amplitude modulation is linearly related to the magnitude of the electric field and a measurement of the amplitude enables the voltage to be calculated.

Figure 3C:
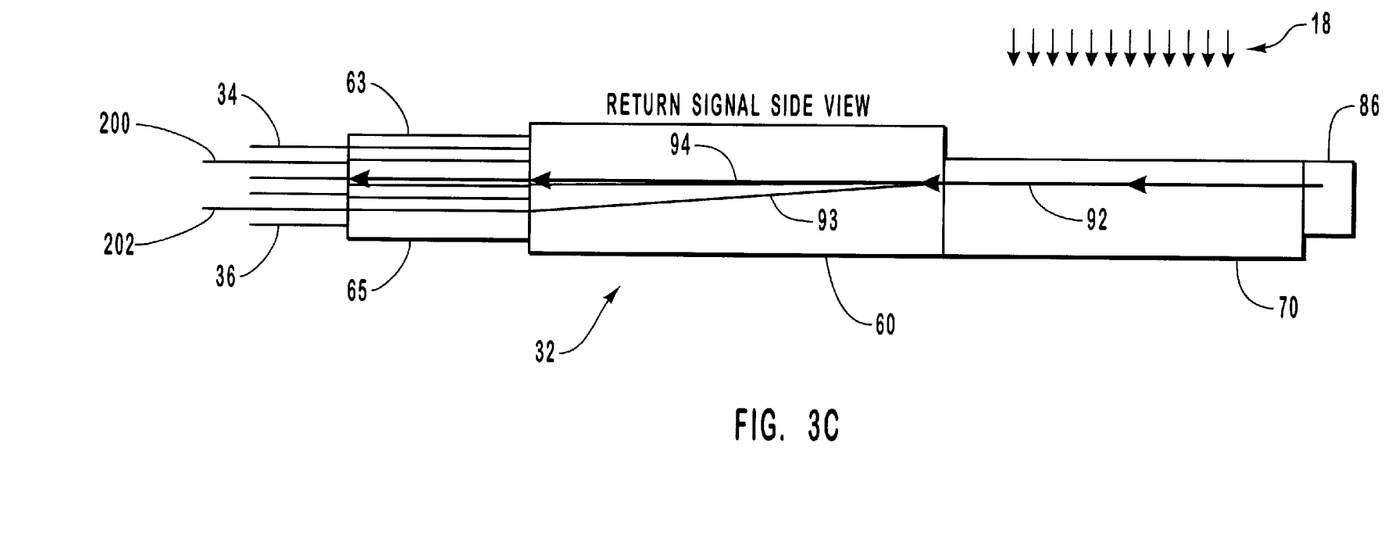
FIG. 3c is a return side view of a preferred embodiment of an electro-optic voltage sensor showing the path of a return beam of electromagnetic radiation after being reflected by a prism.

FIG. 3c is a return signal side view of sensor 32 and illustrates beam 92 as it travels back through crystal 70 and beam displacer 60, after being reflected by prism 80. The return path adds to the Pockels effect and increases the sensitivity of sensor 32. As beam 92 exits crystal 70 and re-enters beam displacer 60, the elliptically polarized beam 92 is separated into two linearly polarized output beams 93 and 94, which are out of phase by 180 degrees, but have equal magnitudes. Output beams 93 and 94 are representative of the major and minor axes of beam 92. As described previously, the separation of the components of beam 92 is possible due to the bi-refringement property of beam displacer 60. In this instance, beam displacer 60 is an example of displacement means for directing an output beam. Other examples of displacement means include a beam splitter or other materials which separate the components of an output beam including calcite. Displacement means is also intended to cover materials having the property of separating an input or output beam into linearly polarized components, which may or may not be orthogonally related.

One of the output beams 93 and 94 is received at output 63 and the other output beam is received at output 65. Outputs 63 and 65 are also equipped with GRIN lenses to collect the beams into the fiber optic cables 34 and 36 as the output beams exit beam displacer 60. Thus, beam displacer 60 also serves as a beam splitter and is an example of beam splitting means for separating orthogonal components of an elliptically or other wise polarized beam.

Crystal 70 is preferably a z-cut MgO doped lithium niobate crystal. The advantage of the z-cut lithium niobate crystal is that the index of refraction is equal for the x and y axes when the crystal is not subject to an electric field. This is important because in a crystal where the indices of refraction that are orthogonal to the direction of wave propagation are not equal, temperature differences can introduce an intrinsic phase differential that is related to temperature rather than strength of the electric field. In the example illustrated in FIGS. 3a through 3e, the indices of refraction in the x and y axes are equal, which eliminates the effect of temperature on the intrinsic phase differential.

In sum, the effect of temperature, with respect to sensor 32, is essentially eliminated by the present invention.

Figure 4A:
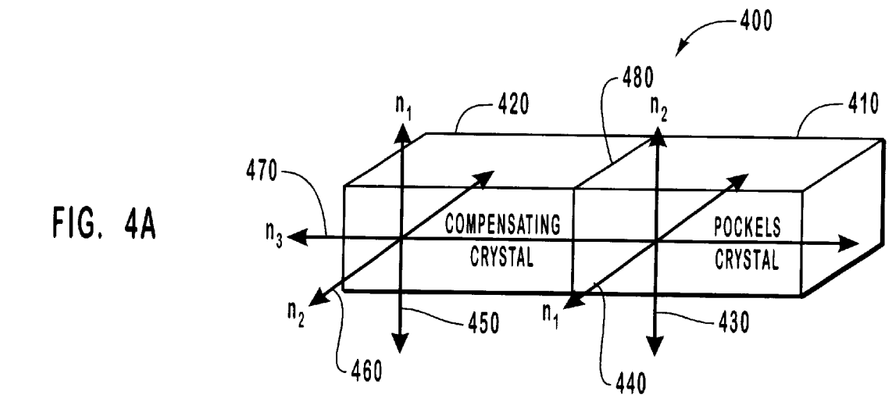
FIG. 4a is a side view of a sensor that can be used in a preferred embodiment to compensate for environmental variations.

Alternatively, crystal 70 may be replaced with the arrangement designated generally as 400 in FIG. 4a Arrangement 400 includes Pockels crystal 410 and compensating crystal 420, optically coupled at 480. Pockels crystal 410 is one example of a Pockels effect means and compensating crystal 420 is an example of a compensating means. In contrast to crystal 70, the intrinsic indices of refraction for Pockels crystal 410 labeled as $n_1$, $n_2$, and $n_3$, numbered as 440, 430, and 470, respectively, are not equal. Specifically, $n_1$ does not equal $n_2$, and neither $n_1$ nor $n_2$ depend on $n_3$. As described above, unequal indices of refraction generate intrinsic phase shifts that vary with temperature, thereby introducing a temperature-sensitive error that must be considered. An example of a crystal as described in FIG. 4a is Y-cut lithium niobate.

In the prior art, errors due to temperature are generally addressed as a signal processing problem after the output beams have been converted to electrical signals. However, the present invention uses compensating crystal 420 to eliminate temperaturebased errors that occur when a Pockels cell's $n_1$ and $n_2$ are unequal. The compensating crystal 420 is preferably the same material and same dimension as Pockels crystal 410. This insures that $n_1$ 450 of compensating crystal 420 equals $n_1$ 440 of Pockels crystal 410 and that $n_2$ 460 of compensating crystal equals $n_2$ 430 of Pockels crystal 410. With equal indices of refraction, the distance traveled through each crystal should be substantially equal; the length along $n_3$ 470 of compensating crystal 420 is substantially equal to the corresponding length of Pockels crystal 410.

Compensating crystal 420 is rotated ninety degrees with respect to Pockels Crystal 410. This rotation matches $n_1$ 440 of Pockels crystal 410 with $n_2$ 460 of compensating crystal 420 and $n_2$ 430 of Pockels crystal 410 with $n_1$ 450 of compensating crystal 420. Because phase shifts are additive, the phase shift for a beam traveling through compensating crystal 420 and Pockels crystal 410 corresponds to $n_1+n_2$, for each plane oscillation, meaning that any temperature-sensitive intrinsic error added by a mismatch between $n_1$ and $n_2$ is eliminated. In other word, a beam traveling through compensating crystal 420 and Pockels crystal 410 experiences an effective index of refraction, for both planes of oscillation, of $n_1+n_2$, meaning for arrangement 400, the indices of refraction for both planes of oscillation are effectively equal.

Where compensating crystal 420 and Pockels crystal 410 are the same material, compensating crystal 420 must be shielded from the electric field that produces the Pockels Effect in Pockels crystal 410. Otherwise, the effect of the electric field on a beam passing through Pockels Crystal 410 would be reversed in compensating crystal 420, just as the temperature-sensitive phase error was eliminated. Shielding from an electric field is well-known in the art and, therefore, the invention does not impose any particular form of shielding. For example, compensating crystal 420 may be coated with a conductive material; this coating would be one example of an electric field shielding means. In the event that compensating crystal 420 does not exhibit a Pockels effect, no electric field shielding is necessary. The present invention therefore contemplates embodiments where the compensating crystal is not of the same material as the Pockels crystal.

Figure 4B:
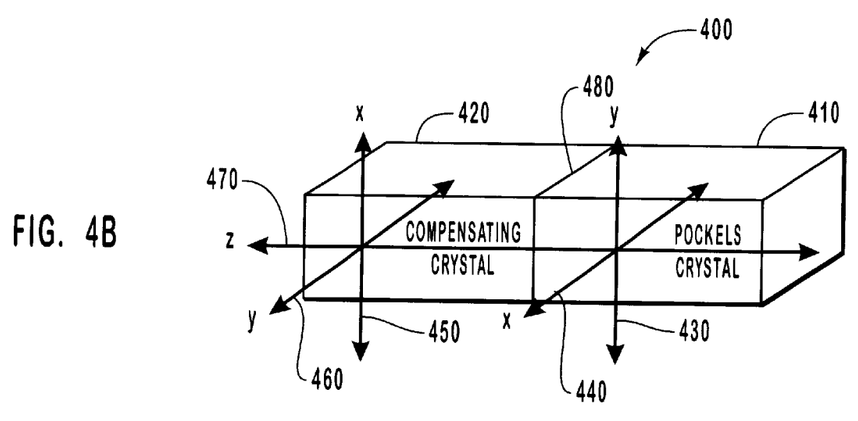
FIG. 4b show the sensor of FIG. 4a oriented with respect to a particular coordinate system.

FIG. 4b shows arrangement 400 in the context of a particular coordinate system useful in describing crystals. From FIG. 4a, $n_1$, $n_2$, and $n_3$ have been replaced with x, y, and z, respectively. It should be noted that the present invention does not impose any particular dimensions or geometry, including the ordering of components. The significant characteristic of compensating crystal 420 is that it is optically equivalent to Pockels crystal 410, but rotated ninety degrees (i.e., at least for beams propagating in the $n_3$ 470 direction). By varying dimensions, indices of refraction, etc., a wide variety of geometries and materials may be used in practicing the present invention and all are within its scope.

Furthermore, those skilled in the art will recognize that errors may result from imperfections in the physical geometry of Pockels crystal 410 and compensating crystal 420. The present invention does not impose any particular tolerance on embodiments used in practicing the invention. For example, some applications may allow for lower manufacturing precision that other applications. As such, words like substantially, approximately, and essentially must be evaluated in terms of a particular application rather than in isolation. Ideally, Pockels crystal 410 and compensating crystal 420 are exactly the same material, exactly the same length along $n_3$ 470, and rotated exactly ninety degrees with respect to one another. However, those skilled in the art will recognize that some level of imperfection is expected and the level of imperfection that can be tolerated may depend on how the present invention is used.

Figure 3D:
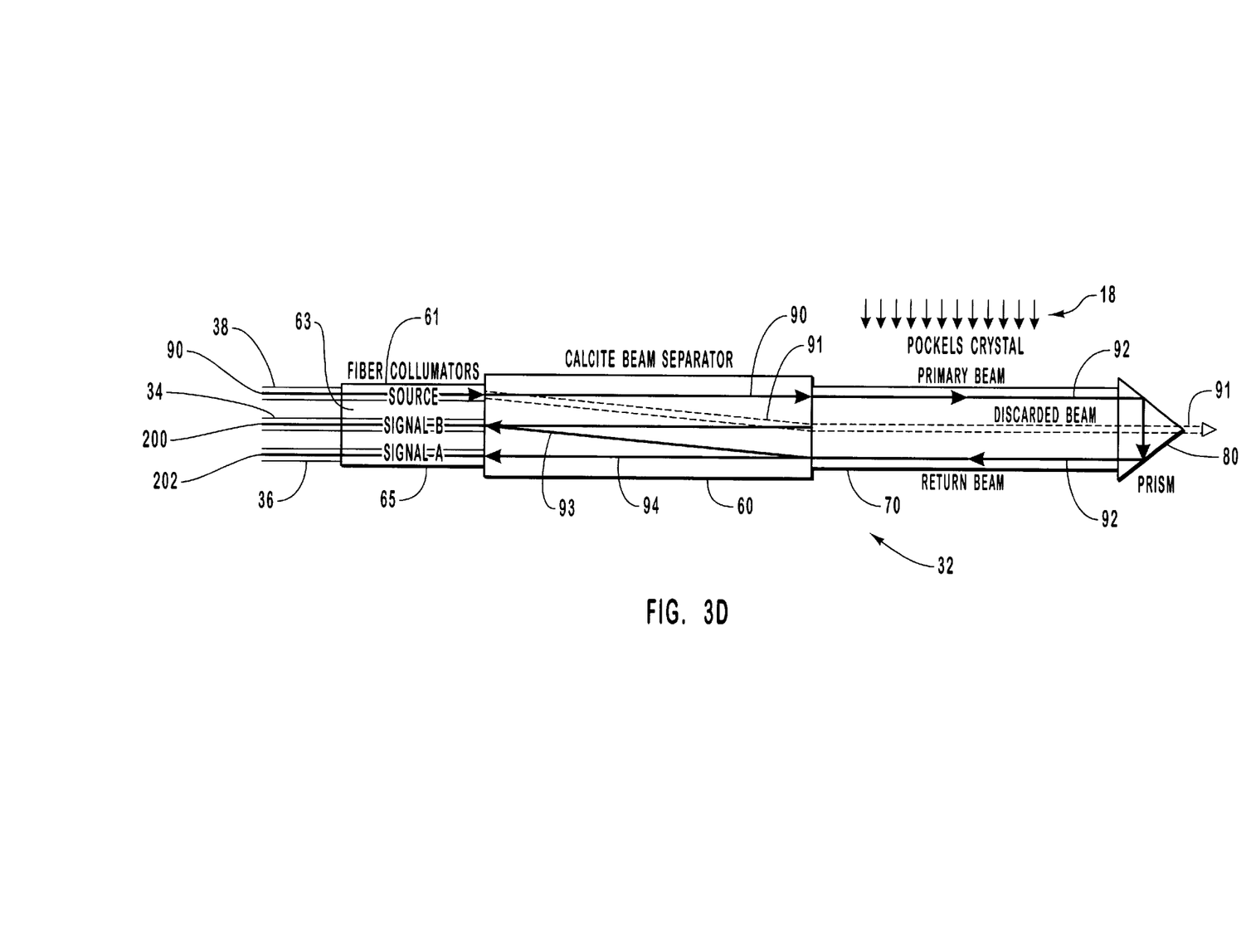
FIG. 3d is a top view of a preferred embodiment of the electro-optic voltage sensor showing the input beam and the output beams as they propagate through the sensor device.

FIG. 3d is a top side view of sensor 32 and more fully details the path of an input beam and the output beams. An input beam is transmitted by fiber optic cable 38 to input 61, which is a GRIN lens in one embodiment that effectively collimates the input beam such that the input beam is not dispersed but is directed through sensor 32. As illustrated, the input beam is separated into beam 90 and beam 91 by beam displacer 60. Beam 90 and beam 91 are linearly polarized beams that are propagating along orthogonal planes. As illustrated, beam 91 is discarded and does not enter crystal 70. As described above, the orientation of beam displacer 60 with respect to crystal 70 causes beam 90 to enter crystal 70 at a rotated angle with respect to the axes of crystal 70. The preferred angle of rotation is 45 degrees such that beam 92 may be represented by vectors in the x and y directions which are equal in magnitude but different in phase as beam 92 experiences the electric field.

Beam 92 then encounters prism 80, which functions to reflect beam 92 back through crystal 70 as illustrated in FIG. 3d, which illustrates the return path of beam 92 to outputs 63 and 65. Prism 80 is an example of reflecting means for reflecting beam 90. Other examples of reflecting means include a mirror or an optical fiber. As beam 92 returns through crystal 70, electric field 18 continues to impose a differential phase shift on the minor and major axes of elliptically polarized beam 92.

In the elliptically polarized beam 92 which is propagating through crystal 70, beam 92 has at least two components which propagate along at least two orthogonal planes respectively. The phase of the components in each plane of propagation are the object of a shift relative to the phase of the component in the other plane. The Pockels electro-optic effect changes the relative phases of the components of beam 92 by altering their respective velocities along the different axes of crystal 70. The magnitude of the differential phase shift is proportional to the magnitude of electric field 18, which is related to the voltage being measured.

In practice, sensor 32 is encased in a dielectric material which improves uniformity in the electric field, particularly around the edges of crystal 70. This encourages the uniformity in the phase shift of the beam passing through crystal 70 and minimizes the stress of the voltage on the materials in and surrounding sensor 32.

Figure 3E:
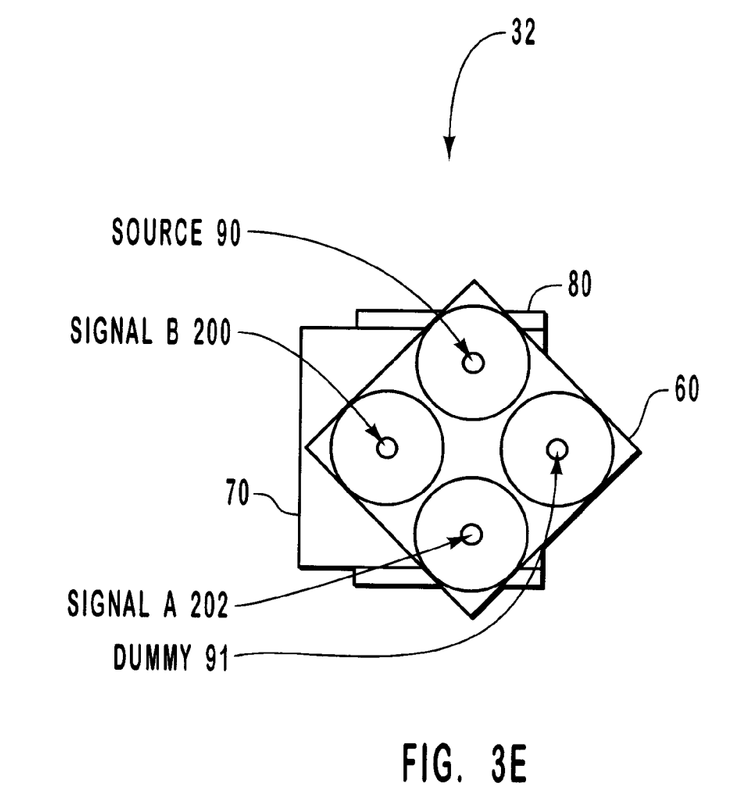
FIG. 3e is an end view of a voltage sensor associated with FIG. 3d which illustrates the orientation of the input and output structures as well as the position of the input and output beams propagating through the voltage sensor.

As further illustrated in FIG. 3d, the return path of beam 92 causes beam 92 to re-enter beam displacer 60. Again, the orientation of beam displacer 60 with respect to crystal 70 and the bi-refringement property of beam displacer 60 causes the major and minor axes of beam 90 to separate and travel as linearly polarized beams 93 and 94. Beams 93 and 94 are orthogonal with respect to each other. Thus, beam displacer 60 again performs the function of a half-wave plate without the effects of temperature. Beams 93 and 94 are received at outputs 63 and 65 respectively. Outputs 63 and 65 typically collect beams 93 and 94 using a GRIN lens and focus the collected beams on a fiber optic cable. As illustrated in FIGS. 3a and 3e, input 61 and outputs 63 and 65 are conveniently located at the same end of sensor 32 and outputs 63 and 65 and input 61 are examples of structural elements through which an output beam or an input beam may be communicated to or from sensor 32. The use of beam displacer 60 eliminates the need for a beam splitter to separate the orthogonal components of beam 90, which allows for a more compact electro-optic voltage sensor.

In FIG. 3d, the output signals are represented as output signal 200 and output signal 202. Each output is an amplitude modulated signal that is representative of either the major or minor axis of the elliptically polarized light produced from the effects of the electric field. Output signals 200 and 202 are collected using a GRIN lens or other collecting device and transmitted to detector 49 illustrated in FIG. 1. The amplitude modulated output signals are received by photo detectors 42 and 44 where they are converted to electrical signals and are referred to herein as component A and component B. Because FIG. 3d is a top side view, FIG. 3e illustrates an end view of the orientation of the input and output beams associated with the top view of FIG. 3d.

FIG. 3e again illustrates the positioning of beam displacer 60, crystal 70 and prism 80 such that the propagating beam may be used to measure the voltage associated with the electric field. Also, in FIGS. 3b, 3c and 3d, electric field 18 is illustrated. Electric field 18 is not intended to indicate the direction of the electric field. Rather, electric field 18 is intended to illustrate the presence of an electric field.

It is important to understand that the voltage being measured can be determined using only one of the output beams. In fact, the output beams are equal in magnitude, but out of phase by 180 degrees. Using component A and component B to compute the voltage allow power fluctuations in the power of the light source to be eliminated from the calculation of the voltage. The voltage being measured is determined from a signal equal to the difference of components A and B divided by the sum of components A and B. The signal is a sine squared signal and the peak-to-peak output can be determined using an arcsine function. The RMS value can be determined from the peak-to-peak output.

One problem associated with this computation is that the power of the light source may vary, or may be affected by the physical components in use. This can be remedied using a scaling factor in software which accounts for offset and gain components. The scaling factor is easily determined because the components A and B are presumably equal. The scaling factor is used to make components A and B equal before any calculations are performed. An offset scaling factor may also be introduced if the input beam does not enter the Pockels cell or crystal at exactly 45 degrees. Another factor is often used to compensate for the variations in the electric field which are attributable to temperature changes in the dielectric which may exist in the electric field (illustrated as insulator 24 in FIG. 1).

The present invention may also be utilized in power computations in combination with a current sensor. The present invention as described herein has advantages which include: small size and weight, increased safety from high voltage hazards, linearity, large dynamic range, high bandwidth, no direct contact required for sensing and no voltage divider hardware requirements, compatibility with past, present and future power substation control and metering systems, temperature insensitivity, and relatively low cost.

It is to be understood that the above described arrangements are intended as illustrative embodiments of the present invention and are not intended to limit the invention. Numerous modifications and alternative arrangements may be devised by those skilled in the art without departing from the spirit and scope of the present invention. Thus, while the present invention has been shown in the drawings and described hereinabove with particularity and detail in connection with what is presently deemed to be the most practical and preferred embodiment of the invention, it is apparent that numerous modifications including, but not limited to, size, material, shape, form, function, and manner of operation may be made without departing from the principles and concepts set forth herein.

We claim:

1. A crystal, through which an input beam may be propagated, for use in an electric field generated by a voltage that self-compensates for environmental variations, the crystal comprising:

a Pockels crystal having three orthogonal indices of refraction designated $n_{p1}$, $n_{p2}$, and $n_{p3}$; and a compensating crystal possessing optical properties substantially identical to the Pockels crystal, the compensating crystal having three orthogonal indices of refraction, designated $n_{c1}$, $n_{c2}$, and $n_{c3}$, that correspond to the similarly numbered indices of refraction of the Pockels crystal, wherein the compensating crystal is optically coupled to and rotated approximately 90 degrees with respect to the Pockels crystal, such that $n_{c1}$ of the compensating crystal is oriented in the same direction as $n_{p2}$ of the Pockels crystal and $n_{c2}$ of the compensating crystal is oriented in the same direction as $n_{p1}$ of the Pockels crystal.

2. A sensor as recited in claim 1, wherein the sensor further comprises electric field shielding around the compensating crystal to insure the compensating crystal does not produce a Pockels effect on the input beam in response to the electric field.

3. A sensor as recited in claim 1 wherein the sensor self-compensates for temperature variations.

4. A sensor as recited in claim 1 wherein the Pockels crystal and the compensating crystal are substantially identical in length.

5. A sensor as recited in claim 1 wherein the compensating crystal is the same material as the Pockels crystal.

6. A sensor as recited in claim 1 wherein the shielding comprises a conductive coating around the compensating crystal.

7. A sensor as recited in claim 1 further comprising a reflector optically coupled to the Pockels crystal, the reflector redirecting optical beams back through the Pockels crystal and the compensating crystal.

8. A sensor as recited in claim 1 wherein $n_{p1}$ is in an x-axis orientation, $n_{p2}$ is in a y-axis orientation, and $n_{p3}$ is in a z-axis orientation.

9. A sensor as recited in claim 1 wherein the Pockels crystal and the compensating crystal are Y-cut lithium niobate.

10. An electro-optical sensor for use in an electric field that self-compensates for temperature variations induced on an input beam propagating through the sensor, the sensor comprising:

Pockels effect means having three orthogonal indices of refraction designated $n_{p1}$, $n_{p2}$, and $n_{p3}$ for generating a phase differential on the input beam in response to the electric field;

compensating means optically coupled to the Pockels effect means for substantially canceling temperature sensitive variations in the phase differential of the input beam; and electric field shielding means for preventing the compensating means from exhibiting a Pockels effect.

11. A sensor as recited in claim 10 wherein the compensating means has three orthogonal indices of refraction, designated $n_{c1}$, $n_{c2}$, and $n_{c3}$ that correspond to the similarly numbered indices of refraction of the Pockels effect means, the compensating means is rotated approximately 90 degrees with respect to the Pockels effect means, such that $n_{c1}$ of the compensating means is oriented in the same direction as $n_{p2}$ of the Pockels effect means and $n_{c2}$ of the compensating means is oriented in the same direction as $n_{p1}$ of the Pockels effect means, and the Pockels effect means and the compensating means have substantially identical physical dimensions.

12. A sensor as recited in claim 10 wherein the compensating means and the Pockels effect means are formed of the same material.

13. A sensor as recited in claim 10 wherein the electric field shielding means comprises a conductive coating around the compensating means.

14. A sensor as recited in claim 10 further comprising a reflector means optically coupled to the Pockels effect means for redirecting optical beams back through the Pockels effect means and the compensating means.

15. A sensor as recited in claim 10 wherein $n_{p1}$ is in an x-axis orientation, $n_{p2}$ is in a y-axis orientation, and $n_{p3}$ is in a z-axis orientation.

16. A sensor as recited in claim 10 wherein the Pockels effect means and the compensating means are Y-cut lithium niobate.

17. A method of self-compensating for environmental variations induced in an input beam propagating through an electro-optical sensor subject to an electric field, the method comprising the acts of:

selecting a Pockels crystal having three orthogonal indices of refraction designated $n_{p1}$, $n_{p2}$, and $n_{p3}$;

selecting a compensating crystal possessing optical properties substantially identical to the Pockels crystal, the compensating crystal having three orthogonal indices of refraction, designated $n_{c1}$, $n_{c2}$, and $n_{c3}$, that correspond to the similarly numbered indices of refraction of the Pockels crystal;

rotating the compensating crystal approximately 90 degrees with respect to the Pockels crystal, such that $n_{c1}$ of the compensating crystal is oriented in the same direction as $n_{p2}$ of the Pockels crystal and $n_{c2}$ of the compensating crystal is oriented in the same direction as $n_{p1}$ of the Pockels crystal;

optically coupling the compensating crystal and the Pockels crystal; and placing electric field shielding around the compensating crystal to insure the compensating crystal does not produce a Pockels effect on the input beam.

18. A method as recited in claim 17 wherein the method compensates for temperature sensitive variations in a phase differential of the input beam.

19. A method as recited in claim 17 wherein the Pockels crystal and the compensating crystal are substantially identical in length, further comprising the acts of:

placing $n_{p1}$ in an x-axis orientation;

placing $n_{p2}$ in a y-axis orientation; and placing $n_{p3}$ is in a z-axis orientation.

20. A method as recited in claim 17 wherein the compensating crystal and the Pockels crystal are the same material.

21. A method as recited in claim 17 wherein the shielding comprises a conductive coating around the compensating crystal.

22. A method as recited in claim 17 further comprising the acts of:

selecting a reflector, the reflector redirecting optical beams back through the Pockels crystal and the compensating crystal; and optically coupling the reflector to the Pockels crystal.

23. A method as recited in claim 17 wherein the Pockels crystal and the compensating crystal are Y-cut lithium niobate.

24. A system, in an environment having a voltage and an electric field, for measuring the voltage, the system comprising:

a detector comprising:
  a light source for generating an input beam; and
  a first and second photo detector for receiving a first and second output beam; and a sensor operably connected to the detector, the sensor comprising:
  a Pockels crystal for receiving a first component of the input beam,
  wherein the Pockels crystal is oriented in the electric field such that the first component experiences a phase differential to produce an elliptically polarized output beam;

a compensating crystal shielded from the electric field and optically connected to the Pockels crystal, the compensating crystal possessing optical properties substantially identical to the Pockels crystal and rotated approximately 90 degrees with respect to the Pockels crystal such that a portion of the phase differential attributable to temperature variations is eliminated; and a beam displacer optically connected to the compensating crystal and oriented at an angle with respect to the compensating crystal, wherein the beam displacer:
  receives the input beam from the light source and separates the input beam into the first and second components, wherein the first and second components are orthogonal and the first component impinges the compensating crystal at the angle; and
  receives the elliptically polarized output beam from the compensating crystal and separates the elliptically polarized output beam into the first and second output beams which represent a major axis and a minor axis of the elliptically polarized output beam; and a signal processor for receiving at least one signal from the first and second photo detectors, wherein the signal processor computes the voltage from the at least one signal.

25. A system as defined in claim 24, wherein the sensor further comprises a prism optically connected to the Pockels crystal, wherein the elliptically polarized output beam is reflected back into the Pockels crystal towards the beam displacer.

26. A system as defined in claim 24, wherein the beam displacer causes the first component to impinge the Pockels crystal at the angle, wherein the angle is 45 degrees.

27. A system as defined in claim 24, wherein the sensor further comprises:
  an input graded index lens operably connected to the light source for collimating the input beam; and
  a first and second output graded index lens operably connected to the at least one photo detectors for collecting the first and second output beams.

28. A system as defined in claim 24, wherein the Pockels crystal and the compensating crystal are Y-cut lithium niobate.

29. An electro-optic sensor for measuring a voltage while subjected to an electric field generated by the voltage, the sensor comprising:

a Pockels crystal, having Pockels crystal axes, for receiving a linearly polarized first component of an input beam, the Pockels crystal being oriented in the electric field such that the first component experiences a differential phase shift to produce an output beam having a major axis component and a minor axis component, wherein the output beam is amplitude modulated by a frequency of the electric field;

a compensating crystal shielded from the electric field and optically connected to the Pockels crystal, the compensating crystal possessing optical properties substantially identical to the Pockels crystal and rotated approximately 90 degrees with respect to the Pockels crystal;

a beam displacer, having beam displacer axes, oriented at an orientation angle such that the Pockels crystal axes are offset from the beam displacer axes by the orientation angle, wherein the beam displacer:

receives an input beam and separates the light beam into a linearly polarized first component and a linearly polarized second component, wherein the linearly polarized first component is parallel to one of the beam displacer axes and impinges the Pockels crystal at the orientation angle; and receives the output beam from the Pockels crystal and separates the output beam into the major axis component and the minor axis component, whereby the voltage is determined by analyzing the amplitude of at least one of the major axis component and the minor axis component; and a prism for reflecting the linearly polarized first component which enters the Pockels crystal from the beam displacer back towards the beam displacer.

30. A sensor as defined in claim 29, wherein the beam displacer is calcite.

31. A sensor as defined in claim 29, wherein the sensor further comprises a signal processor for receiving the major axis component and the minor axis component from the beam displacer at a first and second photo detector.

32. A sensor as defined in claim 31, wherein the signal processor computes the voltage according to the amplitudes of the minor axis component and the major axis component.

33. A sensor as defined in claim 29, wherein the orientation angle is 45 degrees.

34. A sensor as defined in claim 29, wherein the compensating crystal cancels a portion of the differential phase attributable to temperature variations in the compensating crystal and the Pockels crystal.

35. A sensor as defined in claim 29, wherein the Pockels crystal and the compensating crystal are Y-cut lithium niobate.

* * * * *